United States Patent
Dao et al.

(10) Patent No.: US 9,444,405 B1
(45) Date of Patent: Sep. 13, 2016

(54) METHODS AND STRUCTURES FOR DYNAMICALLY REDUCING DC OFFSET

(71) Applicant: FREESCALE SEMICONDUCTOR, INC., Austin, TX (US)

(72) Inventors: Chris C. Dao, Pflugerville, TX (US); Stefano Pietri, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/864,607

(22) Filed: Sep. 24, 2015

(51) Int. Cl.
*H03M 1/10* (2006.01)
*H03F 1/02* (2006.01)
*H03F 3/45* (2006.01)
*H03F 1/30* (2006.01)

(52) U.S. Cl.
CPC .............. *H03F 1/0205* (2013.01); *H03F 1/30* (2013.01); *H03F 3/45179* (2013.01); *H03F 2203/45038* (2013.01)

(58) Field of Classification Search
CPC .... H03F 1/30; H03F 1/523; H03F 2200/294; H03F 3/505; H03F 1/303; H03F 2200/261; H03F 2200/447; H03F 2203/45456; H03F 2203/45462; H03F 2203/45508; H03F 2203/45652
USPC ....... 330/10, 251, 207, 258, 9, 310, 253, 69, 330/252, 259, 261, 255; 327/39, 513, 560, 327/562, 563, 362, 407, 408; 341/144, 118, 341/120, 135, 136
See application file for complete search history.

(56) References Cited

U.S. PATENT DOCUMENTS

| | | | |
|---|---|---|---|
| 5,644,308 A * | 7/1997 | Kerth ................. | H03M 1/0692 341/120 |
| 6,198,266 B1 * | 3/2001 | Mercer .................. | G05F 1/575 323/275 |
| 6,201,379 B1 * | 3/2001 | MacQuigg ............. | G05F 3/242 323/313 |
| 6,275,098 B1 | 8/2001 | Uehara et al. | |
| 6,388,521 B1 | 5/2002 | Henry | |
| 6,696,894 B1 * | 2/2004 | Huang ................ | H03F 3/45417 330/253 |
| 6,812,684 B1 | 11/2004 | Leifhelm et al. | |
| 6,930,537 B1 | 8/2005 | Ceekala et al. | |
| 7,049,889 B2 * | 5/2006 | Kalb ....................... | H03F 1/301 330/253 |
| 7,084,698 B2 | 8/2006 | Khan et al. | |
| 7,161,341 B1 | 1/2007 | MacLean | |
| 7,456,679 B2 | 11/2008 | Pigott et al. | |
| 7,486,129 B2 | 2/2009 | Pietri et al. | |
| 8,791,683 B1 * | 7/2014 | Porter ...................... | G05F 3/30 323/281 |
| 9,329,804 B2 * | 5/2016 | Lassa ..................... | G06F 3/0688 |
| 2005/0218980 A1 * | 10/2005 | Kalb ....................... | H03F 1/301 330/253 |
| 2010/0103005 A1 * | 4/2010 | Nolan ..................... | H03F 3/195 341/120 |
| 2014/0203794 A1 | 7/2014 | Pietri et al. | |

OTHER PUBLICATIONS

Ranjbar et al, "Single Miller Capacitor Frequency Compensation on Three Stage Amplifier for Large Capacitive Load", Journal of Basic and Applied Scientific Research, 2013, pp. 492-497.

* cited by examiner

*Primary Examiner* — Linh Nguyen (57) ABSTRACT

An amplifier system includes a low offset amplifier having a first signal input, a second signal input, an output, a resistive digital to analog converter (RDAC) coupled between a first amplifying terminal and a second amplifying terminal of the amplifier that provides offset control, and a current supply coupled to the RDAC. The amplifier system further includes a low offset amplifier having a first signal input, a second signal input, an output, a resistive digital to analog converter coupled between a first amplifying terminal and a second amplifying terminal of the amplifier that provides offset control, and a current supply coupled to the RDAC. The amplifier system also further includes a load coupled to the output and to the second input of the amplifier and a controller coupled to the RDAC that provides an offset control of the first and second inputs by controlling the RDAC.

20 Claims, 5 Drawing Sheets

METHODS AND STRUCTURES FOR DYNAMICALLY REDUCING DC OFFSET

BACKGROUND

1. Field

This disclosure relates generally to semiconductor devices, and more specifically, to dynamically reducing DC offset in semiconductor devices.

2. Related Art

Advanced semiconductor devices are being developed that require a supply voltage with 100 milliVolts (mV) or less variation or tolerance. Considering that several tens of milliVolts are eroded by current-resistance (IR) drop within the device and test equipment limitations for calibrating circuitry to provide reference voltages, band gap circuits and other low voltage detectors (LVD), the regulator may not have any operational margin. Yet, it is desirable to provide an LVD with small variation over corner voltages and a wide range of temperatures to allow a microprocessor core to run at tighter voltage with advantages of improved speed, reduced power consumption and leakage, and to increase the reliability of operation. In order to achieve precise LVDs, a precise voltage reference is required. Therefore a band gap circuit that generates the reference voltage may be calibrated or trimmed to achieve a small variation, however the trimming code can only be read as the system is starting and several complications arise.

Conventional band gap reference circuits are composed of a delta base-emitter voltage (Vbe) cell, an amplifier, and a start-up section. Error introduced by the amplifier is equal to its input (referred offset voltage (Vos)) multiplied by a band gap loop gain, which is a gain factor that usually ranges between 10 and 20. An input referred offset voltage of 1 milliVolts (mV) can result in an error up to 20 mV.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein use an integrator to amplify offset at the input of an amplifier. A comparator then determines whether the amplified offset is positive or negative. A controller decrements or increments a counter based on the input from the comparator and provides a control signal to adjust a resistive digital to analog converter (RDAC) setting. Trim settings output by the RDAC drive a differential pair of transistors in an operational transconductance amplifier (OTA) to achieve a negligible amplifier offset. An integrator coupled to the comparator provides a gain stage that helps achieve minimum variation without the need to retrieve trim data from a storage device such as flash memory even before the reference voltage is available to operate the storage device. The trim settings provided by the RDAC may be adjusted dynamically during operation when a change in operating conditions is detected.

Figure 1:
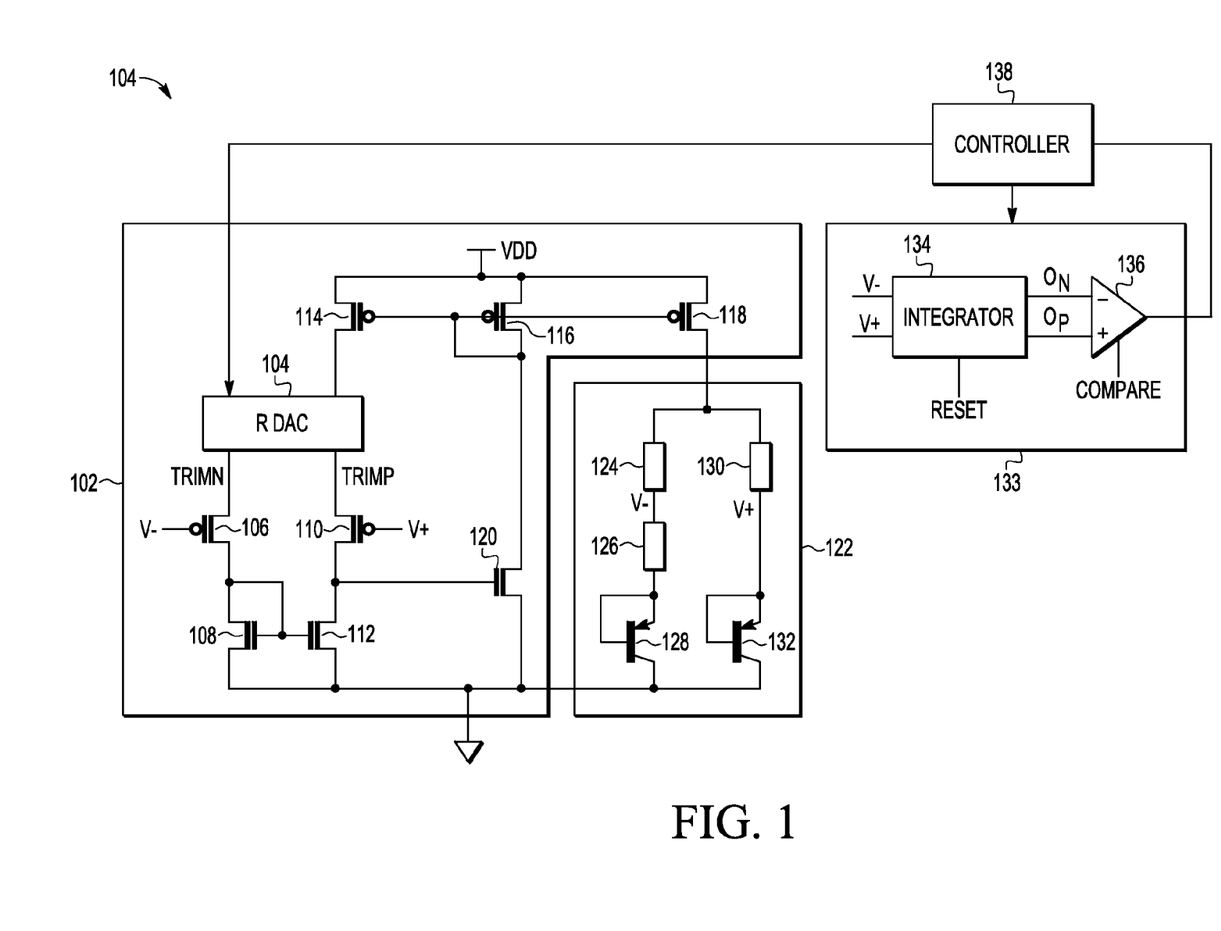
FIG. 1 illustrates a schematic diagram of an embodiment of a band gap system with offset correction in accordance with the present invention.

FIG. 1 illustrates a schematic diagram of an embodiment of a band gap system 100 in accordance with the present invention including an operational transconductance amplifier (OTA) 102 with resistive digital to analog converter (RDAC) 104 coupled to drive respective P-channel transistors 106, 110 with trim signals to reduce or eliminate mismatch between transistors 106, 110 in OTA 102. The source electrodes of P-channel transistors 106, 110 are coupled to respective negative and positive trim outputs TRIMN and TRIMP output by RDAC 104. A load circuit is comprised of a drain electrode of a first N-channel transistor 108 coupled to a drain electrode of P-channel transistor 106 and a drain electrode of a second N-channel transistor 112 coupled to a drain electrode of P-channel transistor 110. The source electrodes of N-channel transistors 108, 112 are coupled to one another and to ground. The control gates of transistors 108, 112 are also coupled to one another. The control gate of transistor 108 is coupled to the drain electrode of transistor 108.

The drain of transistor 110 is coupled to a control gate of N-channel transistor 120. A source electrode of N-channel transistor 120 is coupled to ground and a drain electrode of N-channel transistor 120 is coupled as input to a current mirror comprised of P-channel transistors 116 and 118. In particular, the drain electrode of N-channel transistor 120 is coupled to the drain electrode of P-channel transistor 116. A source electrode of P-channel transistor 116 is coupled to a source electrode of P-channel transistor 118. Supply voltage VDD is coupled to the source electrodes of transistors 116 and 118. The drain electrode of transistor 116 is coupled to the control gate of transistor 116. The control gates of transistors 116 and 118 are coupled to one another. A drain electrode of transistor 118 is coupled as a reference current input to band gap circuit 122.

N-channel transistor 120 is provided to pass current to band gap circuit 122. P-channel transistor 116 in which the gate and the drain are coupled to each other acts as current-voltage converting means. By applying the converted voltage to the gate terminal of the other P-channel transistor 118 as a component of the current mirror, current according to the size ratio (the gate width ratio) between the transistors 116 and 118 is passed to the P-channel transistor 118 and to band gap circuit 122. In some embodiments, transistors 116 and 118 can have the same size so the current of the transistor 116 is passed to transistor 118.

P-channel transistor 114 includes a source electrode coupled to supply voltage VDD, a drain electrode coupled to provide current to RDAC 104, and a control electrode coupled to the control gate of transistor 116.

Band gap circuit 122 includes resistors 124, 126 coupled in series with each other and with bipolar junction transistor 128 between a power supply terminal to which a first power supply voltage Vref is applied and a second power supply voltage Vss such as a ground potential (0V) is applied. Resistor 130 and bipolar transistor 132 are coupled in series with each other and in parallel to resistors 124, 126 and transistor 128 between the first power supply voltage Vref and the second power supply voltage Vss. Resistors 124 and 130 can have the same resistance value. Transistors 128 and 132 can be set so that the emitters have a ratio of 1:n. In some embodiments, transistor 128 may be replaced with "n" number of diodes connected in parallel of the equivalent size as that of the transistor 128.

Voltage V− is taken at a node between resistor 124 and resistor 126. Voltage V+ is taken at a node between resistor 130 and transistor 132. Voltages V− and V+ are provided as input to trimmable OTA 102. The output of trimmable OTA 102 is provided as voltage Vref to band gap circuit 122.

Offset detector 133 includes integrator 134 and comparator 136. Voltages V− and V+ are provided as input to integrator 134. Integrator 134 provides amplified positive and negative output signals OP and ON to respective negating and non-negating inputs of comparator 136. And output from comparator 136 indicating whether V− is greater than V+ is provided to controller 138, which generates a control signal to adjust the setting of RDAC 104 based on whether a positive or negative difference between V− and V+ is detected. Integrator 134 is coupled to receive a RESET signal that is set to clear the integrator once offset is trimmed. Comparator 136 is coupled to a COMPARE signal that indicates when the outputs of integrator 134 are ready to be compared.

During operation, it is desirable for the reference voltage Vref to be stable over a specified range of temperatures. In reality, although transistors 106, 110 have identical design specifications, it is difficult to fabricate them to have exactly the same characteristics due to variations in semiconductor fabrication. The difference between transistors 106, 110 causes an offset in which the voltage V− and the voltage V+ have different magnitudes, so that a precise reference voltage cannot be generated. Accordingly, transistors 106 and 110 are trimmed using RDAC 104 so that the adjusted reference current and voltage output by trimmable OTA 102 is stable.

Figure 2:
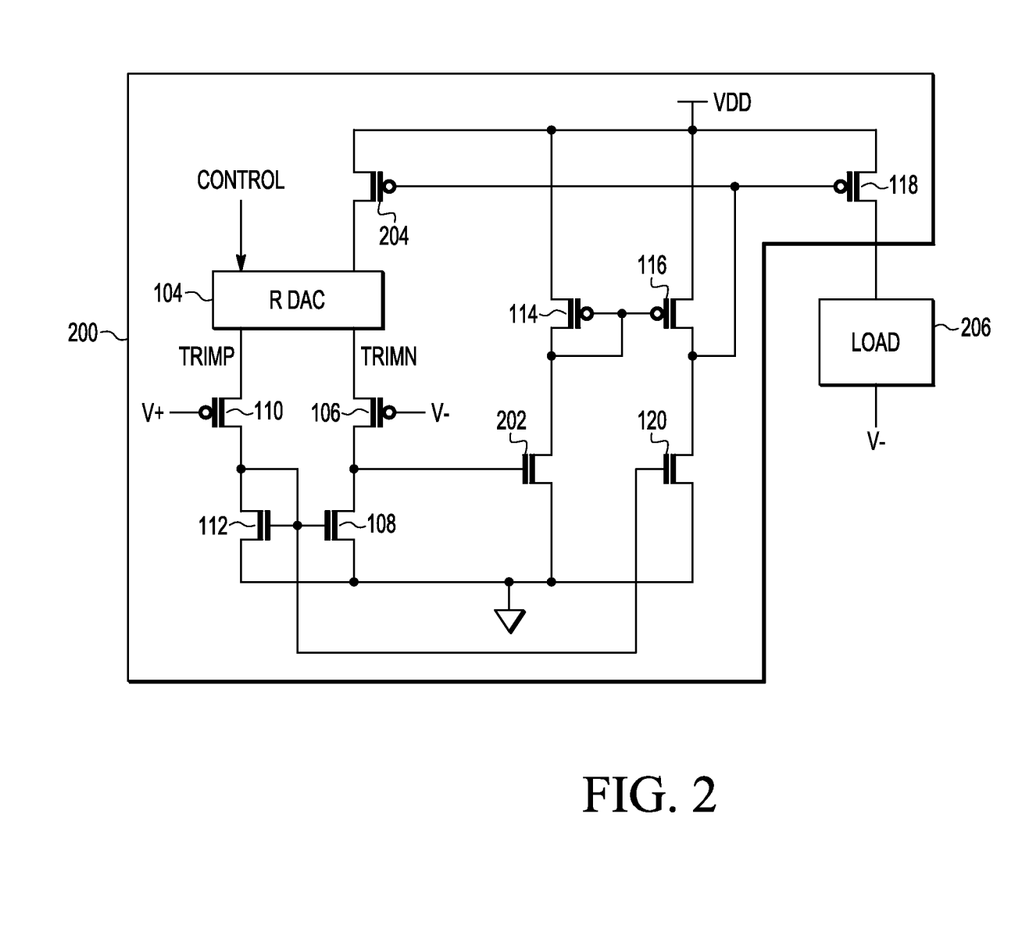
FIG. 2 illustrates a schematic diagram of another embodiment of an operational transconductance amplifier (OTA) with offset correction for driving a load in accordance with the present invention.

FIG. 2 illustrates a schematic diagram of another embodiment of an operational transconductance amplifier (OTA) 200 with offset correction for driving a load 206 in accordance with the present invention. OTA 200 includes RDAC 104, and transistors 106, 108, 110, 112, 114, 116, 120 configured as shown in FIG. 1. OTA 200 further includes N-channel transistor 202 and P-channel transistor 204 that form a third amplifier stage. P-channel transistor 118 is similar to transistor 118 shown in FIG. 1, but the gate of transistor 118 is coupled to the gate electrode of transistor 204 instead of the gate electrodes of transistors 114 and 116. Load 206 is coupled to the drain electrode of transistor 118 and can be any circuitry or device that requires a reference signal with little or no DC offset error, such as band gap circuit 122 of FIG. 1 or any other low voltage detector (LVD) circuitry.

N-channel transistor 202 includes a drain electrode coupled to the drain electrode of P-channel transistor 114, a source electrode coupled to ground, and a control electrode coupled between the drain electrode of P-channel transistor 106 and the drain electrode of N-channel transistor 108. P-channel transistor 204 includes a source electrode coupled to supply voltage VDD, a drain electrode coupled to RDAC 104, and a gate electrode coupled to the gate electrode of transistor 118.

Although not shown in FIG. 1, OTA 100 typically includes compensation capacitors coupled in parallel between the gate electrode of transistor 120 and the drain electrode of transistor 110. A second compensation capacitor can be coupled in parallel with the drain electrode transistor 118. With the three amplifier stages of OTA 200, the same or better stability can be achieved with higher amplification and less area requirement by using a smaller compensation capacitor coupled in parallel with the drain electrode transistor 118, while eliminating the need for the compensation capacitor coupled between the gate electrode of transistor 202 and ground.

Devices that use OTA 100 and 200 may include integrated circuits comprising low-voltage metal-oxide semiconductor (MOS) or other low-voltage, high precision circuits that require a stable, precise voltage for efficient operation. The power on sequence provides power supply voltage such as VDD to OTAs 102, 200. Another voltage may be provided as VSS, which in one implementation is ground (0 Volts) or a virtual ground voltage level that is lower than VDD.

Figure 3:
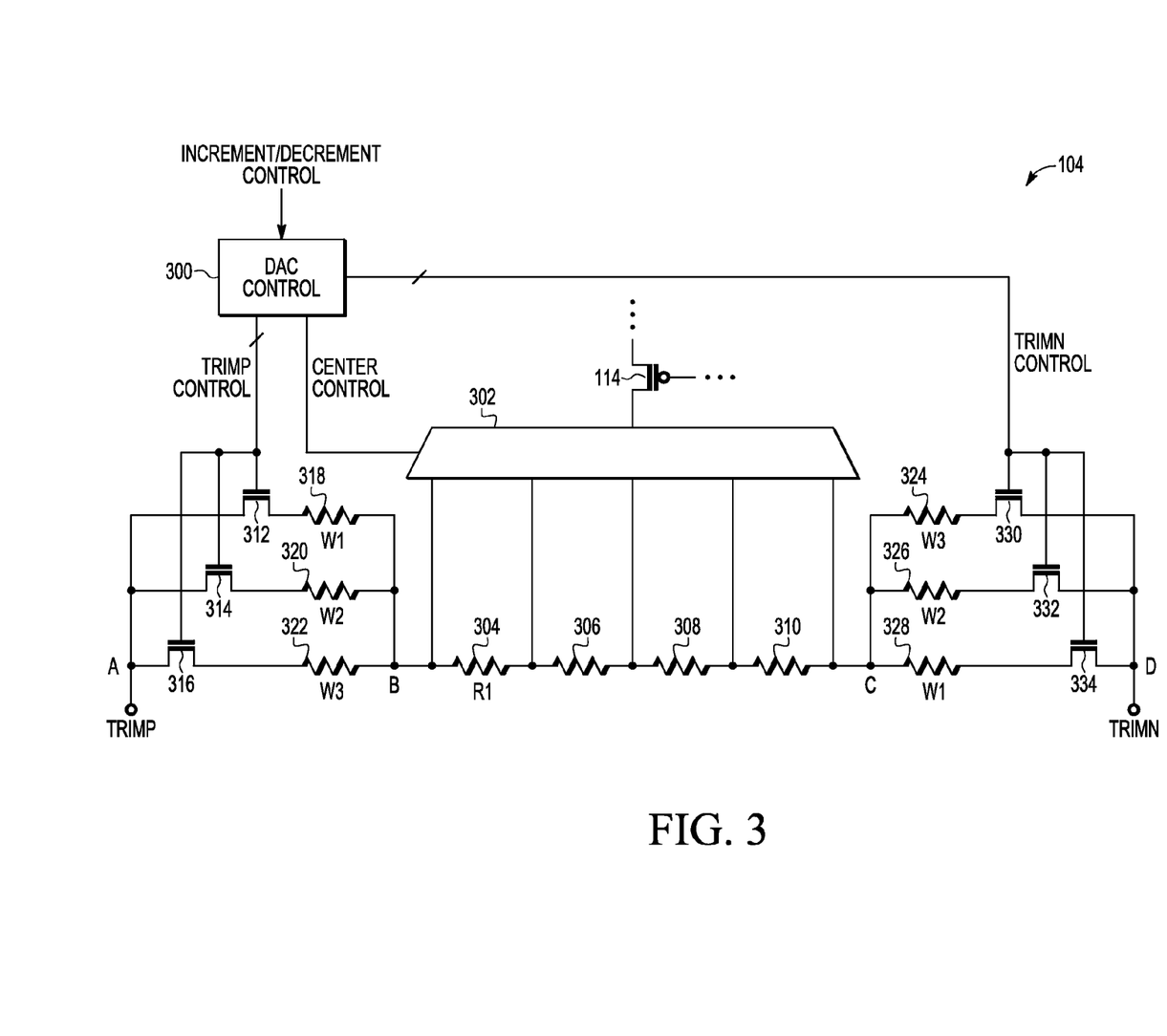
FIG. 3 illustrates a schematic diagram of an embodiment of resistive digital to analog converter (RDAC) that can be used in the band gap system of FIG. 1 and in another system that includes the OTA of FIG. 2.

Referring to FIGS. 1, 2 and 3, FIG. 3 illustrates a schematic diagram of an embodiment of resistive digital to analog converter (RDAC) 104 that can be used in the band gap system 100 of FIG. 1 and in other systems that include OTA 200 in FIG. 2. RDAC 104 includes DAC control module 300, multiplexer 302, a central signal path including resistors 304, 306, 308, 310; a positive signal path with N-channel transistors 312, 314, 316 and resistors 318, 320, 322; and a negative signal path with N-channel transistors 330, 332, 334 and resistors 324, 326 and 328.

Gate electrodes of transistors 312, 314, 316 and coupled to a respective one of TRIMP control signals supplied over a multi-signal bus from DAC control 300. Source electrodes of transistors 312, 314, 316 are coupled together at node A to provide a positive trim signal TRIMP to transistor 110 in amplifiers 102, 200. Drain electrodes of transistors 312, 314, 316 are coupled in series with respective resistors 318, 320, 322. A second terminal of each of resistors 318, 320, 322 is coupled to node B and to a first terminal of resistor 304. Transistor 312 and resistor 318 are coupled in parallel with transistor 314 and resistor 320, and with transistor 316 and resistor 322. Transistor 314 and resistor 320 are coupled in parallel with transistor 316 and resistor 322.

Gate electrodes of transistors 330, 332, 334 and coupled to a respective one of TRIMN control signals supplied over a multi-signal bus DAC control 300. Source electrodes of transistors 330, 332, 334 are coupled together at node D to provide a negative trim signal TRIMN to transistor 106 in amplifiers 102, 200. Drain electrodes of transistors 330, 332, 334 are coupled in series with respective resistors 324, 326 and 328. A second terminal of each of resistors 324, 326 and 328 is coupled together and to a first terminal of resistor 304 at node C. Transistor 330 and resistor 324 are coupled in parallel with transistor 326 and resistor 332, and with transistor 334 and resistor 328. Transistor 326 and resistor 332 is coupled in parallel with transistor 334 and resistor 328.

Resistors 304, 306, 308, 310 are coupled in series with one another. Multiplexer 302 includes a first output terminal coupled between resistor 304 and a node B coupled to a terminal of resistors 318, 320, 322, a second output terminal coupled between resistors 304 and 306, a third output terminal coupled between resistors 306 and 308, a fourth output terminal coupled between resistors 308 and 310, and a fifth output terminal coupled between resistor 310 and node C coupled to a terminal of each of resistors 324, 326, 328. Note that RDAC can include additional resistors coupled in series with resistors 304, 306, 308 and multiplexer can include corresponding additional output terminals coupled between respective pairs of the additional resistors. Further, positive and negative trim circuits can include additional series-coupled transistor/resistor pairs connected in parallel with the series-coupled transistor/resistor pairs 312/318, 314/320, 316/322, 324/330, 326/332, 328/334.

Multiplexer 302 further includes a control input terminal coupled to receive a center control signal from DAC control 300. The center control signal selects one output terminal of multiplexer 302 coupled between resistors 304-310, between resistor 304 and node B, and between resistor 310 and node C to conduct current from the drain electrode of transistor 114 (FIGS. 1 and 2) coupled to an input terminal of multiplexer 302. The output at which current is coupled to resistors 304-310 determines level of voltage at the TRIMP and TRIMN signals. The increment/decrement control signal provided to DAC control 300 is translated to the center control signal provided to multiplexer 302. If the increment/decrement control signal indicates an increment, the center control signal is adjusted to increase the number of resistors included to produce the TRIMP signal and decrease the number of resistors included to produce the TRIMN signal. If the increment/decrement control signal indicates a decrement, the center control signal is adjusted to decrease the number of resistors included to produce the TRIMP signal and increase the number of resistors included to produce the TRIMN signal. The effective resistance provided by RDAC 104 can be further adjusted by placing transistors 312-316 and 330-334 in conductive or non-conductive mode independently of one another to allow fine tuning or adjustment of the overall resistance value applied to the TRIMP and TRIMN signals.

Resistors 318, 320, 322, and 324, 326, 328 can have weighted resistance values compared to the resistance values of resistors 304-310. For example, each of resistors 304-310 can have the same normalized value of 1, while resistors 318, 324 can have weight W1 which is ¼ the resistance of resistors 304-310, resistors 320, 326 can have weight W2, which is ½ the resistance of resistors 304-310, and resistors 322, 328 can have weight W3, which is ¾ the resistance of resistors 304-310. Other suitable weighting factors can be used.

Figure 4:
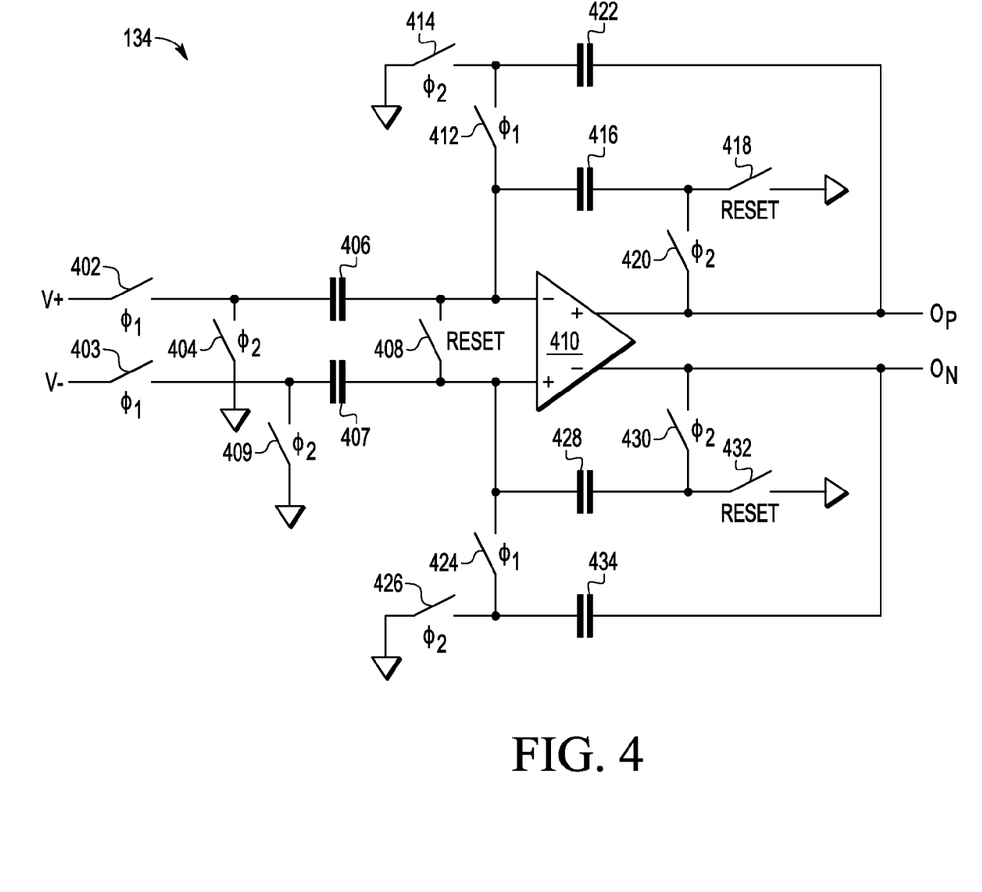
FIG. 4 shows a schematic diagram of an embodiment of an integrator that can be used in the band gap system of FIG. 1 and in another system that includes the OTA of FIG. 2.

FIG. 4 shows a schematic diagram of an embodiment of integrator 134 that can be used in the band gap system 100 of FIG. 1 and in other systems that include OTA 200 in FIG. 2. Integrator 134 includes switches 402, 412, 403, 424 controlled by first clock signal φ1, switches 404, 409, 414, 420, 426 and 430 controlled by second clock signal φ2, switches 408, 418, 432 controlled by the RESET signal, capacitors 406, 407, 416, 422, 428, 434, and fully differential amplifier 420.

Integrator 134 includes a positive signal path that provides positive trim output OP and a negative signal path that provides negative trim output ON. In the positive signal path, switch 402 includes a first terminal coupled to voltage V+ and a second terminal coupled to a first terminal of capacitor 406. A second terminal of capacitor 406 is coupled to a negating input of fully differential amplifier 420. Switch 404 has a first terminal coupled between the second terminal of switch 402 and the first terminal of capacitor 406, and a second terminal coupled to ground. Capacitor 416 includes a first terminal coupled between a first terminal of switch 412 and the second terminal of capacitor 406. A second terminal of capacitor 416 is coupled to a first terminal of switch 418. A second terminal of switch 418 is coupled to ground. Switch 420 includes a first terminal coupled between the second terminal of capacitor 416 and the first terminal of switch 418, and a second terminal coupled to a non-negating output of comparator that provides output OP. A second terminal of switch 412 is coupled between a first terminal of switch 414 and a first terminal of capacitor 422. A second terminal of switch 414 is coupled to ground. A second terminal of capacitor 422 is coupled to comparator output OP.

In the negative signal path, switch 403 includes a first terminal coupled to voltage V+ and a second terminal coupled to a first terminal of capacitor 407. A second terminal of capacitor 407 is coupled to a non-negating input of fully differential amplifier 420. Switch 409 has a first terminal coupled between the second terminal of switch 403 and the first terminal of capacitor 409, and a second terminal coupled to ground. Capacitor 428 includes a first terminal coupled between a first terminal of switch 424 and the second terminal of capacitor 407. A second terminal of capacitor 428 is coupled to a first terminal of switch 432. A second terminal of switch 432 is coupled to ground. Switch 430 includes a first terminal coupled between the second terminal of capacitor 428 and the first terminal of switch 432, and a second terminal coupled to a negating output of comparator that provides output ON. A second terminal of switch 424 is coupled between a first terminal of switch 426 and a first terminal of capacitor 434. A second terminal of switch 426 is coupled to ground. A second terminal of capacitor 434 is coupled to comparator output ON.

Switch 408 has a first terminal coupled between the second terminal of capacitor 406 and the negating input to fully differential amplifier 420, and a second terminal coupled between the second terminal of capacitor 406 and the non-negating input to fully differential amplifier 420.

Figure 5:
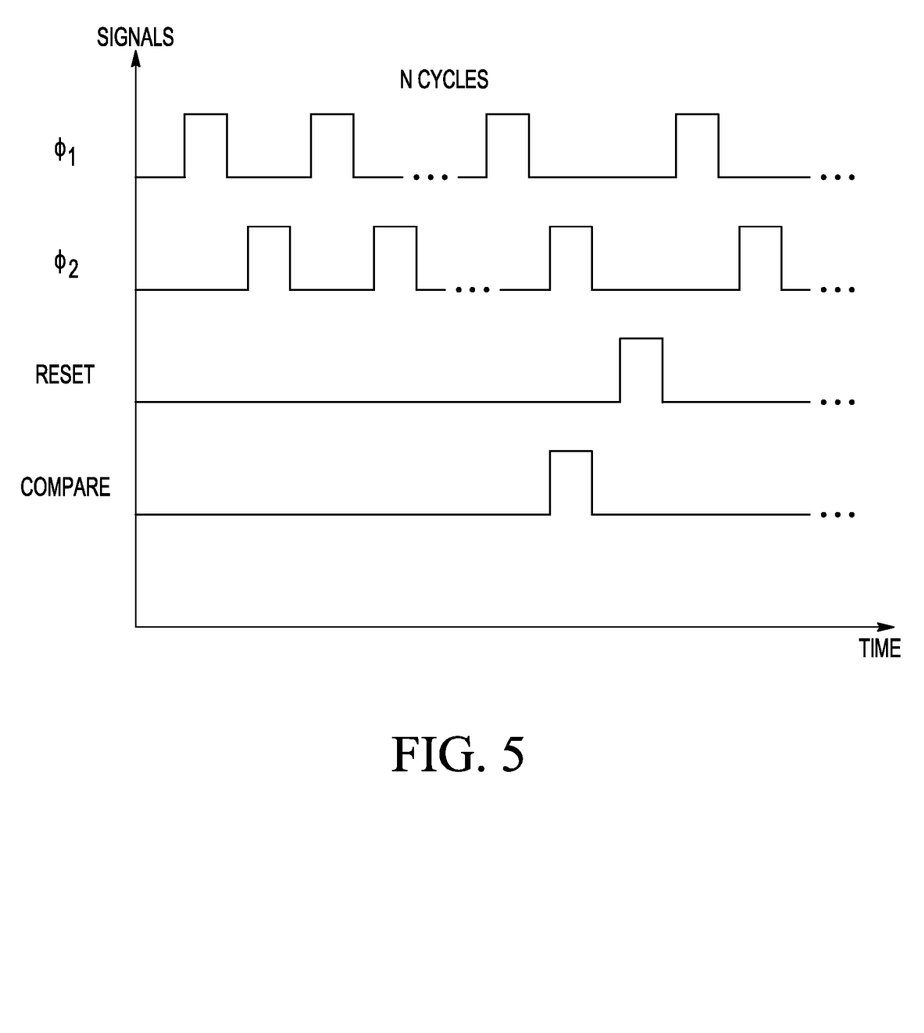
FIG. 5 shows an embodiment of a signal timing diagram that can be used in the integrator of the band gap system of FIG. 1 and with another system that includes the OTA of FIG. 2.

The operation of integrator 134 is described with reference to FIGS. 4 and 5. FIG. 5 shows an embodiment of a signal timing diagram that can be used in the integrator 134 of the band gap system of FIG. 1 and with another system that includes OTA 200 of FIG. 2. FIG. 5 shows multiple (n) cycles of non-overlapping clock signals φ1 and φ2 occurring during one cycle of COMPARE and RESET signals.

Initially the RESET signal is asserted, causing the integrator to reset. Then clock signal φ1 is asserted and switches 402, 412, 403, 424, are closed; clock signal φ2, RESET, and COMPARE signals are set so that switches 404, 408, 409, 414, 418, 420, 426, 430, and 432 remain open. Input voltages V+ and V− are stored on capacitor 406 and 407, respectively, and the amplifier is in closed loop configuration so the amplifier offset voltage is stored on capacitors 422 and 434.

The sampling phase is over as φ1 goes low so that switches 402, 412, 403, 424 are open. Next φ2 is asserted so that switches 404, 409, 414, 420, 426 and 430 are closed. Charge from capacitors 406 and 407 is transferred to respective capacitors 416, 428 while capacitors 422, 434 are discharged. During subsequent n-cycles, integrating capacitors 416, 428 accumulate charge from capacitors 406, 407 each cycle until the charge on capacitors 416, 428 reaches the desired level so that the amplified offset voltage $$OP-ON = n*C406/C416*(V+-V-)$$

is large enough that comparator 136 can reliably determine the sign of OP-ON. For example if we are trying to detect an offset voltage (V+−V−) equal to 0.1 mV, we may use an amplification equal to the number of cycles n times a ratio of capacitor 406 to capacitor 416 equal to 1000. Once the predetermined number of cycles are run, the COMPARE signal is set to enable comparator 136 to determine the sign of the amplified offset voltage (Op-On) and provide the result to controller 138. Once the comparison is taken, the COMPARE signal is set to disable comparator 136 and the RESET signal is set to discharge capacitors 416, 428.

An amplified offset voltage greater than zero (>0) will set the comparator output to a high logic level. An amplified offset voltage lower than zero (<0) will set the comparator output to a low logic level. As an initial setting, RDAC 104 may be initialized with the switches to couple resistors 304 and 306 to the positive trim portion, and to couple resistors 308-310 to the negative trim portion. At least one of transistors 312-316 on the positive trim portion, and at least one of transistors 330-334 will be set to active mode to allow TRIMP and TRIMN signals to be provided as input to transistors 106 and 110.

If the amplified offset is greater than zero, switches in RDAC 104 may be set to reduce the TRIMP signal and increase the TRIMN signal. To make the adjustment, the center control signal from DAC control 300 can be set so that voltage from transistor 114 is applied to a different output of multiplexer 302. For example, the voltage may be applied to the output between resistors 304 and 306 instead of between resistors 306 and 308. To increase the TRIMP signal and decrease the TRIMN signal when the offset is less than zero, the voltage may be applied to the multiplexer output between resistors 308 and 310 instead of between resistors 306 and 308. The offset may be periodically evaluated and corrected to remove the effects of changes in temperature or other operating parameters.

By now it should be appreciated that some embodiments of systems and methods disclosed herein provide OTAs 102, 200 that are capable of adjusting the effective values of resistance applied to TRIMP and TRIMN signals to remove amplifier offset error that may affect various types of systems, such as band gap reference voltage systems or other low voltage detectors. The adjustment is made by determining whether an offset exists, and if so, incrementing or decrementing TRIMN and TRIMP signals coupled to transistors 106, 110. The resistance used for the TRIMN and TRIMP signals can be adjusted until the offset is removed. If another offset is subsequently detected, the resistors can again be adjusted to remove the offset. Note that an adjustment to the resistors in RDAC 104 will affect TRIMP and TRIMN signals simultaneously. This avoids the need to adjust the TRIMN and TRIMP signals separately.

In some embodiments, an amplifier system (100) can comprise a low offset amplifier (102) having a first signal input, a second signal input, an output, a resistive digital to analog converter (RDAC) (104) coupled between a first amplifying terminal and a second amplifying terminal of the amplifier that provides offset control, and a current supply coupled to the RDAC. A load (122) is coupled to the output and to the second input of the amplifier. A controller (138) is coupled to the RDAC that provides an offset control of the first and second inputs by controlling the RDAC.

In another aspect, the amplifier system can further comprise an offset detection circuit (133) coupled to the first and second inputs.

In another aspect, the offset detection circuit can comprise an integrator (134) coupled to the first and second inputs and a comparator (136) coupled to an output of the integrator. The comparator can provide information as to the offset of low offset amplifier to the controller.

In another aspect, the integrator comprises a switched capacitor integrator.

In another aspect, the RDAC can provide a resistance between the first and second amplifying terminals and selects a location along the resistance to provide a current.

In another aspect, the location can be selected by the controller.

In another aspect, the amplifier system can further comprise an offset detection circuit (133) coupled to the first and second inputs. The offset detection circuit can comprise an integrator (134) coupled to the first and second inputs and a comparator (136) coupled to an output of the integrator. The comparator can provide information as to the offset of low offset amplifier to the controller.

In another aspect, the controller can test locations for the current source along the resistance for obtaining a lower offset of the low offset amplifier.

In another aspect, the output can be coupled to the load through a first current mirror and the current source to the RDAC is through a second current mirror coupled to the output:

In another aspect, the first current mirror can comprise a first transistor (202) having a control electrode coupled to the output of the low offset amplifier, a first current electrode coupled to a first power supply terminal, and a second current electrode; a diode-connected transistor (114) coupled between a second power supply terminal and the second current electrode of the first transistor; a second transistor (120) having a control electrode coupled to a complementary output of the low offset amplifier, a first current electrode coupled to the first power supply terminal, and a second current electrode; a third transistor (116) having a control electrode coupled to the second current electrode of the first transistor, a first current electrode coupled to the second power supply terminal, and a second current electrode coupled to the second current electrode of the second transistor; and a fourth transistor (118) having a control electrode coupled to the second current electrode of the third transistor, a first current electrode coupled to the second power supply terminal; and a second current electrode coupled to the load.

In another embodiment, a method of operating an amplifier system (100) that can include an amplifier (102) characterized as having an offset and comprising a first signal input, a second signal input, an output, a first amplifying terminal and a second amplifying terminal, can comprise: coupling a resistance of a resistive digital to analog converter (RDAC) (104) between the first and second amplifying terminals; and reducing the offset by adjusting a location of a current source (114) along the resistance between the first amplifying terminal and the second amplifying terminal.

In another aspect, the reducing can be further characterized as locating the current source at a first location along the resistance, obtaining a first measure of the offset at the first location, changing the location of the current source to a second location, obtaining a second measure of the offset at the second location.

In another aspect, the reducing can be further characterized as changing the location of the current source being in a direction that will reduce the offset if the direction of the offset does not change resulting from the change in location.

In another aspect, the reducing can be further characterized as changing a selection input of the RDAC which selects a location in the resistance.

In another aspect, the obtaining the first measure can comprise coupling the first and second signal inputs to a switched capacitor integrator (134) having dual outputs and having a gain; and coupling the dual outputs of the switched capacitor integrator to a comparator (136) to determine the direction of the offset of the first location.

In another aspect, the obtaining the second measure can comprise, after obtaining the first measure, coupling the first and second signal inputs to the switched capacitor integrator; and after obtaining the first measure, coupling the dual outputs of the switched capacitor integrator to the comparator to determine the direction of the offset at the second location.

In another aspect, the reducing the offset can be further characterized as minimizing the offset by selecting locations for determining the direction of the offset to determine the location in which the a minimum change in either direction along the resistance will not result in a decrease in a magnitude of the offset.

In another aspect, the minimizing can comprise one of a group consisting of successive approximation and sequential testing.

In further embodiments, an amplifier (100) can comprise a resistive digital to analog converter (104) having a resistive chain of resistors at which points along the resistive chain can be selected for receiving a current source; a differential amplifier (102) having a first input, a second input, a first amplifying terminal, and a second amplifying terminal; and an offset detector (103) which selects at which point in the resistive chain the current source is applied to optimize an offset between the first and second inputs.

In another aspect, the offset detector can comprise a switched capacitor integrator (134) having a first input coupled to the first input of the differential amplifier and a second input coupled to the second input of the differential amplifier.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An amplifier system, comprising:
   a low offset amplifier having a first signal input, a second signal input, an output, a resistive digital to analog converter coupled between a first amplifying terminal and a second amplifying terminal of the amplifier that provides offset control, and a current supply coupled to the RDAC;
   a load coupled to the output and to the second input of the amplifier; and
   a controller coupled to the RDAC that provides an offset control of the first and second inputs by controlling the RDAC.

2. The amplifier system of claim 1, further comprising an offset detection circuit coupled to the first and second inputs.

3. The amplifier system of claim 2, wherein the offset detection circuit comprises an integrator coupled to the first and second inputs and a comparator coupled to an output of the integrator, wherein the comparator provides information as to the offset of low offset amplifier to the controller.

4. The amplifier system of claim 2, wherein the integrator comprises a switched capacitor integrator.

5. The amplifier system of claim 1, wherein the RDAC provides a resistance between the first and second amplifying terminals and selects a location along the resistance to provide a current.

6. The amplifier system of claim 5, wherein the location is selected by the controller.

7. The amplifier system of claim 6, further comprising an offset detection circuit coupled to the first and second inputs, wherein the offset detection circuit comprises an integrator coupled to the first and second inputs and a comparator coupled to an output of the integrator, wherein the comparator provides information as to the offset of low offset amplifier to the controller.

8. The amplifier system of claim 7, wherein the controller tests locations for the current source along the resistance for obtaining a lower offset of the low offset amplifier.

9. The amplifier system of claim 8, wherein the output is coupled to the load through a first current mirror and the current source to the RDAC is through a second current mirror coupled to the output.

10. The system of claim 9, wherein the first current mirror comprises:
- a first transistor having a control electrode coupled to the output of the low offset amplifier, a first current electrode coupled to a first power supply terminal, and a second current electrode;
- a diode-connected transistor coupled between a second power supply terminal and the second current electrode of the first transistor;
- a second transistor having a control electrode coupled to a complementary output of the low offset amplifier, a first current electrode coupled to the first power supply terminal, and a second current electrode;
- a third transistor having a control electrode coupled to the second current electrode of the first transistor, a first current electrode coupled to the second power supply terminal, and a second current electrode coupled to the second current electrode of the second transistor; and
- a fourth transistor having a control electrode coupled to the second current electrode of the third transistor, a first current electrode coupled to the second power supply terminal; and a second current electrode coupled to the load.

11. A method of operating an amplifier system, wherein the amplifying system comprises an amplifier characterized as having an offset and comprising a first signal input, a second signal input, an output, a first amplifying terminal and a second amplifying terminal, the method comprising:
- coupling a resistance of a resistive digital to analog converter between the first and second amplifying terminals;
- coupling a load to the output and to the second input of the amplifier; and
- reducing the offset by adjusting a location of a current source along the resistance between the first amplifying terminal and the second amplifying terminal.

12. The method of claim 11, wherein the reducing is further characterized as locating the current source at a first location along the resistance, obtaining a first measure of the offset at the first location, changing the location of the current source to a second location, obtaining a second measure of the offset at the second location.

13. The method of claim 12, wherein the reducing is further characterized as changing the location of the current source being in a direction that will reduce the offset if the direction of the offset does not change resulting from the change in location.

14. The method of claim 12, wherein the reducing is further characterized as changing a selection input of the RDAC which selects a location in the resistance.

15. The method of claim 12, wherein the obtaining the first measure comprises:
- coupling the first and second signal inputs to a switched capacitor integrator having dual outputs and having a gain; and
- coupling the dual outputs of the switched capacitor integrator to a comparator to determine the direction of the offset of the first location.

16. The method of claim 15, wherein the obtaining the second measure comprises:
- after obtaining the first measure, coupling the first and second signal inputs to the switched capacitor integrator; and
- after obtaining the first measure, coupling the dual outputs of the switched capacitor integrator to the comparator to determine the direction of the offset at the second location.

17. The method of claim 11, wherein:
the reducing the offset is further characterized as minimizing the offset by selecting locations for determining the direction of the offset to determine the location in which the a minimum change in either direction along the resistance will not result in a decrease in a magnitude of the offset.

18. The method of claim 17, wherein the minimizing comprises one of a group consisting of successive approximation and sequential testing.

19. An amplifier, comprising:
- a resistive digital to analog converter having a resistive chain of resistors at which points along the resistive chain can be selected for receiving a current source;
- a differential amplifier having a first input, a second input, an output, a first amplifying terminal, and a second amplifying terminal;
- a load coupled to the output and to the second input of the amplifier; and
- an offset detector which selects at which point in the resistive chain the current source is applied to optimize an offset between the first and second inputs.

20. The amplifier of claim 19, wherein the offset detector comprises a switched capacitor integrator having a first input coupled to the first input of the differential amplifier and a second input coupled to the second input of the differential amplifier.

* * * * *